US011862538B2

(12) United States Patent
Lin et al.

(10) Patent No.: US 11,862,538 B2
(45) Date of Patent: Jan. 2, 2024

(54) SEMICONDUCTOR DIE MOUNTED IN A RECESS OF DIE PAD

(71) Applicant: TEXAS INSTRUMENTS INCORPORATED, Dallas, TX (US)

(72) Inventors: Chung-Hao Lin, Pingtung (TW); Hung-Yu Chou, Taipei (TW); Bo-Hsun Pan, New Taipei (TW); Dong-Ren Peng, New Taipei (TW); Pi-Chiang Huang, Taipei (TW); Yuh-Harng Chien, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 140 days.

(21) Appl. No.: 17/463,124

(22) Filed: Aug. 31, 2021

(65) Prior Publication Data

US 2023/0063262 A1    Mar. 2, 2023

(51) Int. Cl.
*H01L 23/495* (2006.01)
*H01L 21/48* (2006.01)
*H01L 21/56* (2006.01)
*H01L 23/31* (2006.01)
*H01L 23/00* (2006.01)

(52) U.S. Cl.
CPC .... *H01L 23/49513* (2013.01); *H01L 21/4825* (2013.01); *H01L 21/565* (2013.01); *H01L 23/3114* (2013.01); *H01L 23/4952* (2013.01); *H01L 24/29* (2013.01); *H01L 24/32* (2013.01); *H01L 24/83* (2013.01); *H01L 2924/181* (2013.01)

(58) Field of Classification Search
CPC ......... H01L 24/48; H01L 24/49; H01L 24/32; H01L 24/83; H01L 2924/181; H01L 23/49513; H01L 23/3114; H01L 23/4952; H01L 23/3107; H01L 21/4825; H01L 21/565

See application file for complete search history.

(56) References Cited

U.S. PATENT DOCUMENTS

| | | | |
|---|---|---|---|
| 2005/0046008 A1* | 3/2005 | Gai | H01L 24/32 257/E23.037 |
| 2006/0006510 A1* | 1/2006 | Koduri | H01L 24/49 257/E23.047 |
| 2012/0208324 A1* | 8/2012 | Harata | H01L 21/568 438/123 |
| 2013/0093072 A1* | 4/2013 | Zhang | H01L 23/49513 257/676 |

(Continued)

*Primary Examiner* — Alonzo Chambliss
(74) *Attorney, Agent, or Firm* — Dawn Jos; Frank D. Cimino

(57) ABSTRACT

In some examples a semiconductor chip package includes a conductive terminal. In addition, the semiconductor chip package includes a die pad including a top side and a recess extending into the top side. The die pad is downset relative to the conductive terminal. Further, the semiconductor ship package includes a semiconductor die positioned within the recess, wherein the semiconductor die has an outer perimeter, and a solder fillet engaged within the recess and with the outer perimeter of the semiconductor die. Still further, the semiconductor chip package includes a wire bond coupled to the semiconductor die and the conductive terminal, and a mold compound covering the conductive terminal, the wire bond, the die pad, and the semiconductor die.

20 Claims, 8 Drawing Sheets

(56) References Cited

U.S. PATENT DOCUMENTS

| | | | |
|---|---|---|---|
| 2013/0221382 A1* | 8/2013 | Wai ................. | H01L 33/62 |
| | | | 257/676 |
| 2013/0241041 A1* | 9/2013 | Yu .................. | H01L 21/4832 |
| | | | 257/676 |
| 2014/0264797 A1* | 9/2014 | Ota ................. | H01L 23/3107 |
| | | | 257/674 |
| 2022/0189856 A1* | 6/2022 | Chang .............. | H01L 24/29 |

* cited by examiner

SEMICONDUCTOR DIE MOUNTED IN A RECESS OF DIE PAD

BACKGROUND

During semiconductor chip manufacturing, circuits may be formed on a wafer of semiconductor material (e.g., silicon). The wafer may then be singulated into a plurality of semiconductor dies. Each die is then processed to form a semiconductor package that may be integrated with an electronic device (e.g., computers, smartphones). Within some semiconductor packages, a die may be mounted to a die pad and electrically coupled to a plurality of conductive terminals. These terminals may be secured to suitable junctions or terminals within the electronic device (e.g., traces formed on a printed circuit board (PCB)).

SUMMARY

In accordance with at least one example of the disclosure, a semiconductor chip package comprises a conductive terminal, a die pad comprising a top side and a recess extending into the top side, wherein the die pad is downset relative to the conductive terminal, and a semiconductor die positioned within the recess, wherein the semiconductor die has an outer perimeter. In addition, the semiconductor chip package comprises a solder fillet engaged within the recess and with the outer perimeter of the semiconductor die, a wire bond coupled to the semiconductor die and the conductive terminal, and a mold compound covering the conductive terminal, the wire bond, the die pad, and the semiconductor die.

In accordance with at least one example of the disclose, a semiconductor chip package comprises a mold compound, a conductive terminal positioned within the mold compound, and a die pad positioned within the mold compound. The die pad comprises a top side that is positioned lower than an uppermost surface of the conductive terminal within the mold compound, and the die pad comprises a recess extending into the top side to a terminal surface. In addition, the semiconductor chip package comprises a semiconductor die fixed within the recess with a solder member.

In accordance with at least one example of the disclose a semiconductor chip package comprises a plurality of conductive terminals, wherein each conductive terminal of the plurality of conductive terminals comprises an uppermost surface. In addition, the semiconductor chip package comprises a die pad comprising a top side and a recess extending into the die pad from the top side to a terminal surface, wherein the top side of the die pad is positioned lower than the uppermost surface of each conductive terminal of the plurality of conductive terminals, and a semiconductor die positioned within the recess, wherein the semiconductor die has an outer perimeter. Further, the semiconductor chip package comprises a solder fillet engaged within the recess and with the outer perimeter of the semiconductor die such that the solder fillet extends from the terminal surface to a point along the outer perimeter that is spaced from 1 millimeter (mm) to 2.5 mm from the terminal surface.

BRIEF DESCRIPTION OF THE DRAWINGS

For a detailed description of various examples, reference will now be made to the accompanying drawings in which.

DETAILED DESCRIPTION

A semiconductor die may be mounted to a die pad within a semiconductor package. In some cases, the semiconductor die may be attached to the die pad using a solder paste. During a reflow process, heat is applied (e.g., via convection, radiation) to the solder paste so as to melt and fuse the solder paste to the die pad and the semiconductor die. Unbalanced wetting forces (e.g., caused by non-uniform heat transfer) may lead to undesired lateral rotation, translation, or other movement of the semiconductor die on the die pad during the reflow process, which may result in misalignment or misplacement of the semiconductor die on the die pad. Ultimately, this unwanted movement of the semiconductor die may frustrate subsequent operations for electrically coupling the semiconductor die to other electrical components (e.g., conductive terminals).

Accordingly, examples disclosed herein include die pads that are configured to prevent excessive movement (e.g., rotation) of a semiconductor die during a reflow process. For instance, in some examples, the example die pads may include a recess that is sized and shaped to constrain movement of the semiconductor die during a reflow process, even if the solder paste experiences unbalanced wetting forces. Thus, through use of the example die pads disclosed herein, a desired position and alignment of semiconductor die may be maintained on a die pad during a reflow process, so that instances of die misalignment may be reduced in a semiconductor package manufacturing process.

Figure 1:
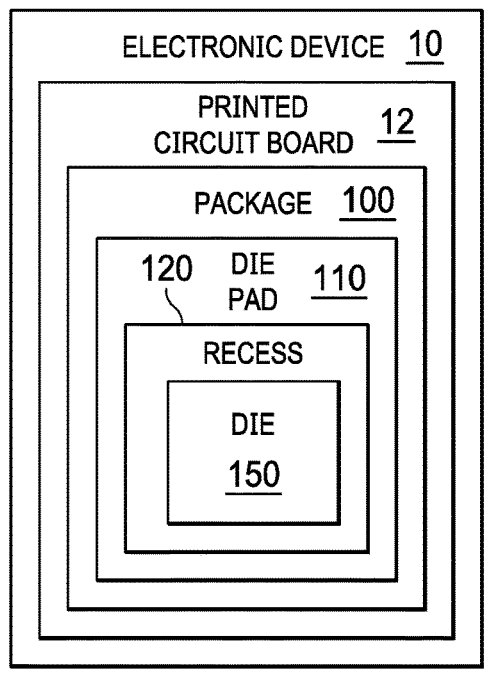
FIG. 1 is a block diagram of an electronic device including a semiconductor die package having a recess in a die pad for receiving a semiconductor die according to some examples.

Referring now to FIG. 1, a block diagram of an electronic device 10 including semiconductor chip package 100 (or more simply "package 100") having a recess 120 in a die pad 110 for receiving a semiconductor die 150 (or more simply "die 150") therein according to some examples is shown. In particular, the electronic device 10 may be a laptop computer, a notebook computer, a desktop computer, a smartphone, an appliance (e.g., a refrigerator, a laundry machine, an oven, a toaster), a television, an automobile or a component within an automobile, an aircraft or a component within an aircraft, a water vehicle or a component within a water vehicle, or any other type of device containing one or more electronic components.

In some examples, the electronic device 10 includes a PCB 12. The package 100 is coupled to the PCB 12. During use of the electronic device 10, the package 100 may receive power and/or data signals and may perform a function or functions that contribute to the overall use and functionality of the electronic device 10. Other components (e.g., such as other semiconductor packages and/or other electronic devices) may be coupled to PCB 12 and potentially coupled to the package 100. However, these possible additional components are not shown in FIG. 1 so as to simplify the drawing.

Figure 2A:
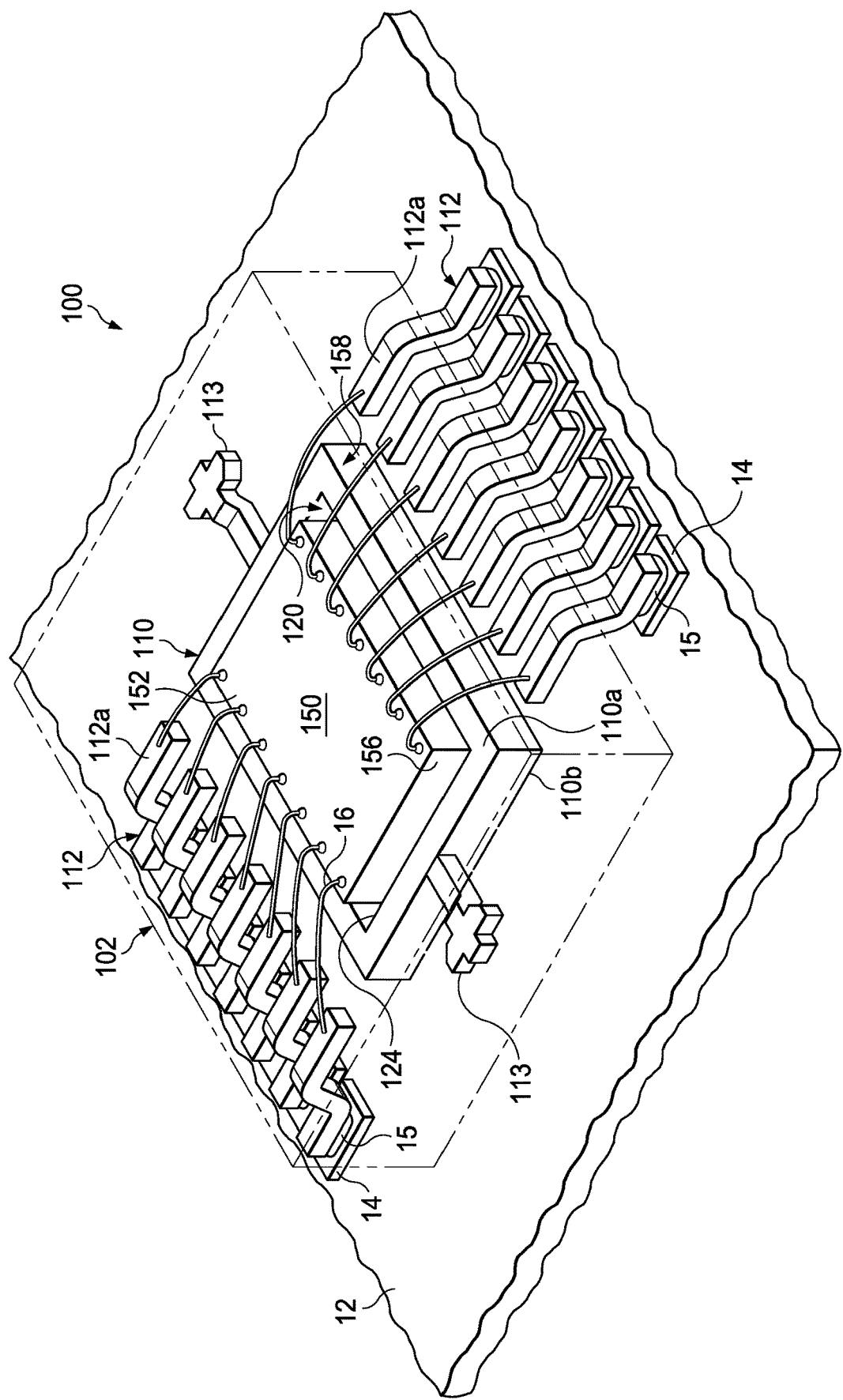
FIG. 2A is a perspective view of a PCB and semiconductor die package having a recess in a die pad for receiving a semiconductor die according to some examples.
Figure 2B:
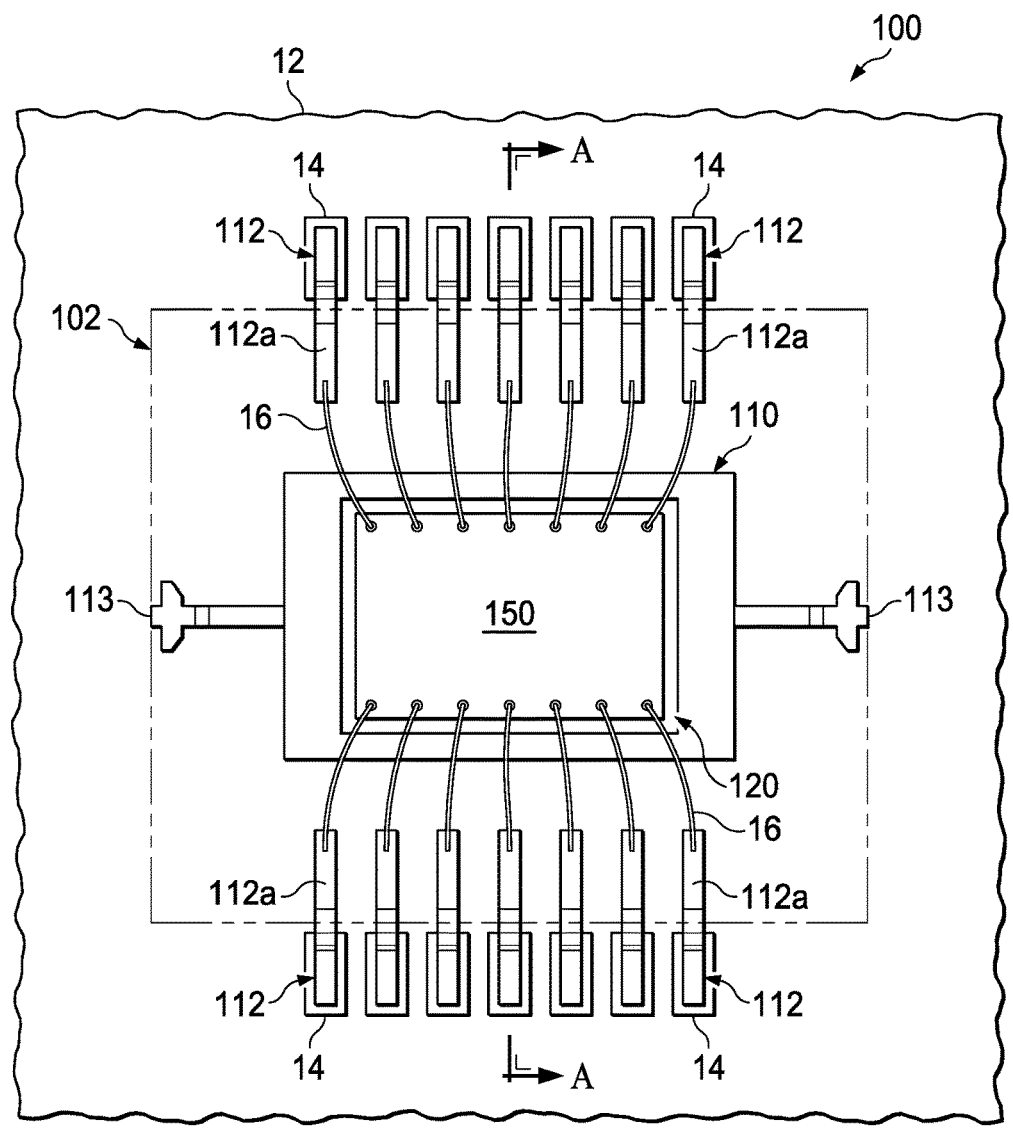
FIG. 2B is a top view of the PCB and semiconductor die of FIG. 2A according to some examples.

Referring now to FIGS. 2A and 2B, a perspective view and top view, respectively, of the PCB 12 and the package 100 are shown according to some examples. As previously described, the package 100 comprises a die 150 mounted within a recess 120 formed in a die pad 110. In addition, the die 150 may be coupled to a plurality of conductive terminals 112 (or more simply "terminals 112") via wire bonds 16. The terminals 112 are also coupled (e.g., with solder 15 shown in FIG. 2C) to a plurality of traces 14 (or any suitable conductive surfaces) formed on PCB 12. Further, a pair of tie bars 113 may be coupled to and may extend from die pad 110 (e.g., at about a 45° angle from the horizontal direction). The die pad 110, die 150, a portion of the terminals 112, and the tie bars 113 are all covered in a dielectric mold compound 102 (or more simply "mold compound 102") to shield the die 150 and the other electrical components (e.g., terminals 112, wire bonds 16) of package 100 from moisture, debris, contaminants, etc.

Figure 2C:
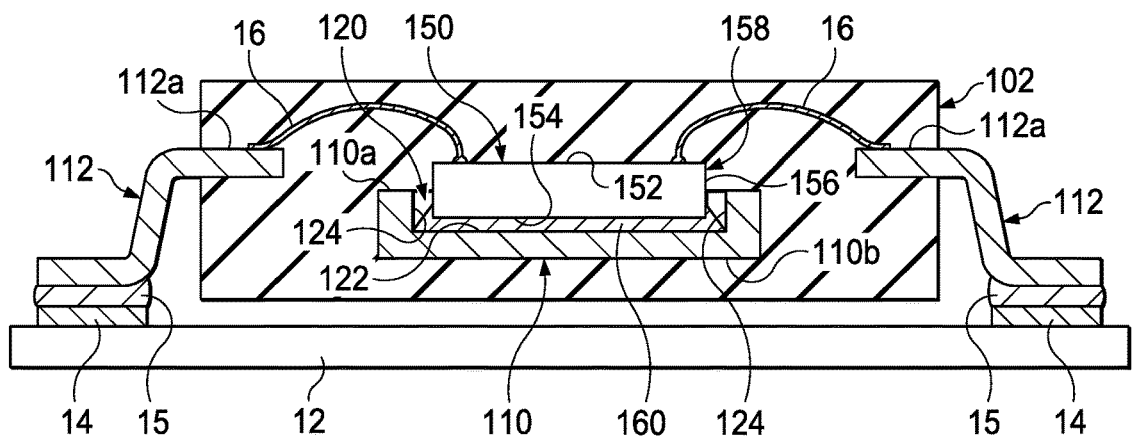
FIG. 2C is a cross-sectional view of the PCB and semiconductor die of FIG. 2A according to some examples.

Referring now to FIG. 2C, a cross-sectional view of the package 100 and PCB 12 taken along section A-A in FIG. 2B is shown. Die pad 110 includes a first or top side 110a and a second or bottom side 110b opposite top side 110a. Top side 110a may comprise a planar surface. Recess 120 extends into die pad from top side 110a (e.g., from the planar surface of top side 110a). In particular, recess 120 includes a terminal surface 122 (which may be referred to herein as a "floor" of recess 120) and a plurality of side walls 124 extending (e.g., perpendicularly to the plane of top side 110a) between top side 110a and terminal surface 122. The terminal surface 122 may comprise a planar surface that is parallel to and offset (e.g., by the side walls 124) from top side 110a (e.g., from the plane of top side 110a).

Die 150 includes a first or device side 152 and a second or non-device side 154 opposite device side 152. A plurality of side walls 156 extend between the device side 152 and non-device side 154 to thereby define an outer perimeter 158 of die 150. The device side 154 may include circuitry (not shown) that is coupled to the terminals 112 via wire bonds 16 as previously described. Specifically, the wire bonds 16 may be coupled to the device side 154 and to uppermost surfaces 112a of the conductive terminals 112.

As shown in FIG. 2C, a solder member 160 fixes and secures the die 150 within the recess 120. More specifically, solder member 160 may be engaged along both the non-device side 154 of die 150 and terminal surface 122 of recess 120. In addition, solder member 160 may also be engaged along outer perimeter 158 (including one or more or all of the side surfaces 156) of die 150 and/or along one or more of the side walls 124 of recess 120. Thus, rotation and lateral movement (e.g., movement toward or away from side walls 124) of die 150 is constrained by solder member 160 within recess 120. The non-device side 154 of die 150 may be positioned within the recess 120, and therefore, spaced between the terminal surface 122 and top side 110a of die pad 110 along the depth of recess 120. Further details of examples of die pad 110 and die 150 are described in more detail below.

As is also shown in FIG. 2C, the die pad 110 is downset relative to the conductive terminals 112. That is, the top side 110a of the die pad 110 is positioned lower than the uppermost surfaces 112a of the conductive terminals 112 within mold compound 102. The bottom side 110b of die pad 110 may be aligned with a bottom side of the mold compound 102, or (as is shown in FIG. 2C) may be spaced from the bottom side of the mold compound 102 (e.g., so that die pad 110 is fully contained within mold compound 102). Without being limited to this or any other theory, the combination of a downset die pad 110 and a recess 120 in die pad 110 for receiving die 150 allows for a more even distribution of components within the mold compound 102. Specifically, the conductive terminals 112, wire bonds 16, die 150, and downset, recessed die pad 110 may be more evenly distributed across a thickness (e.g., a vertical thickness) within the mold compound 102. As a result, the molding operations for forming mold compound 102 may be more efficient and reliable, because a more even distribution of components (e.g., conductive terminals 112, wire bonds 16, die 150, and die pad 110) may allow for a more even and uniform distribution and flow of liquid (or semi-liquid) mold compound 102, so that instances of voids within mold compound 102 are reduced.

The tie bars 113 may extend outward from die pad 110 (e.g., at about a 45° in some examples) so that the outer ends (e.g., extended away from the die pad 110) of tie bars 113 are co-planar with the uppermost surfaces 112a of conductive terminals 112. In addition, as best shown in FIG. 2B, the outer ends of tie bars 113 are co-planar or flush with the outer surface of mold compound 102 such that the outer ends of tie bars 113 are exposed.

Figure 3A:
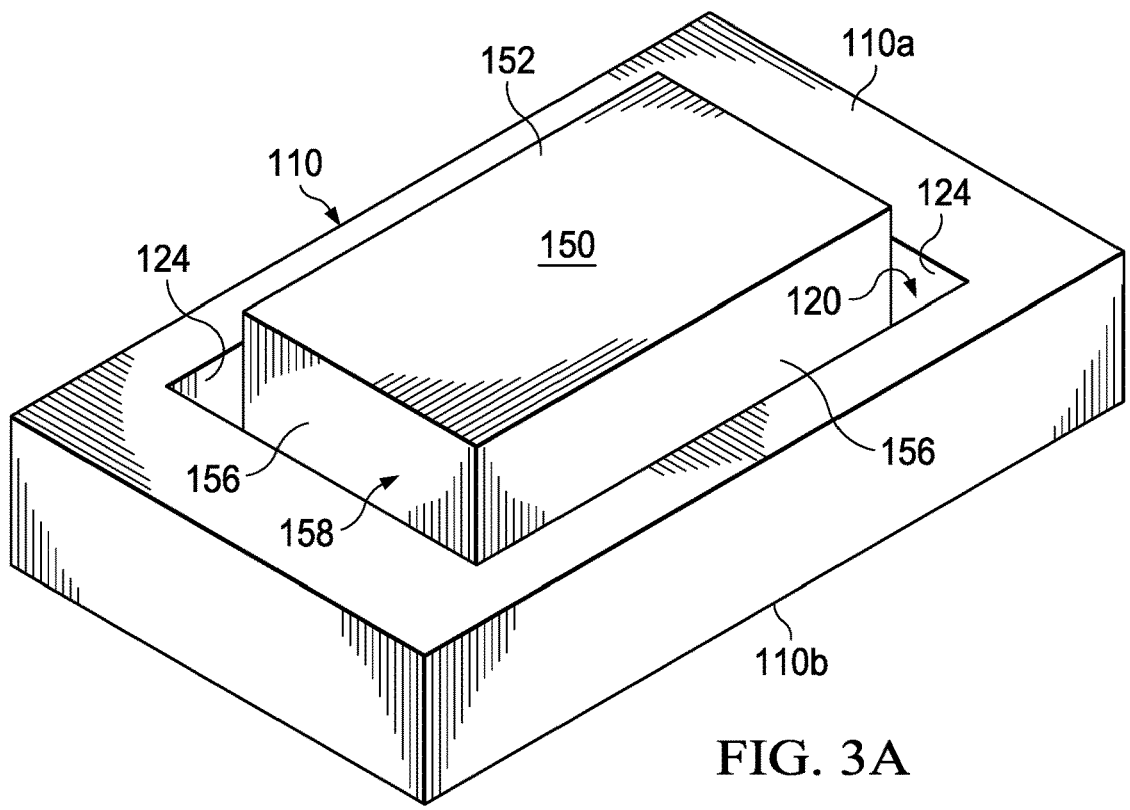
FIG. 3A is a perspective view of a die pad having a recess for receiving a semiconductor die according to some examples.
Figure 3B:
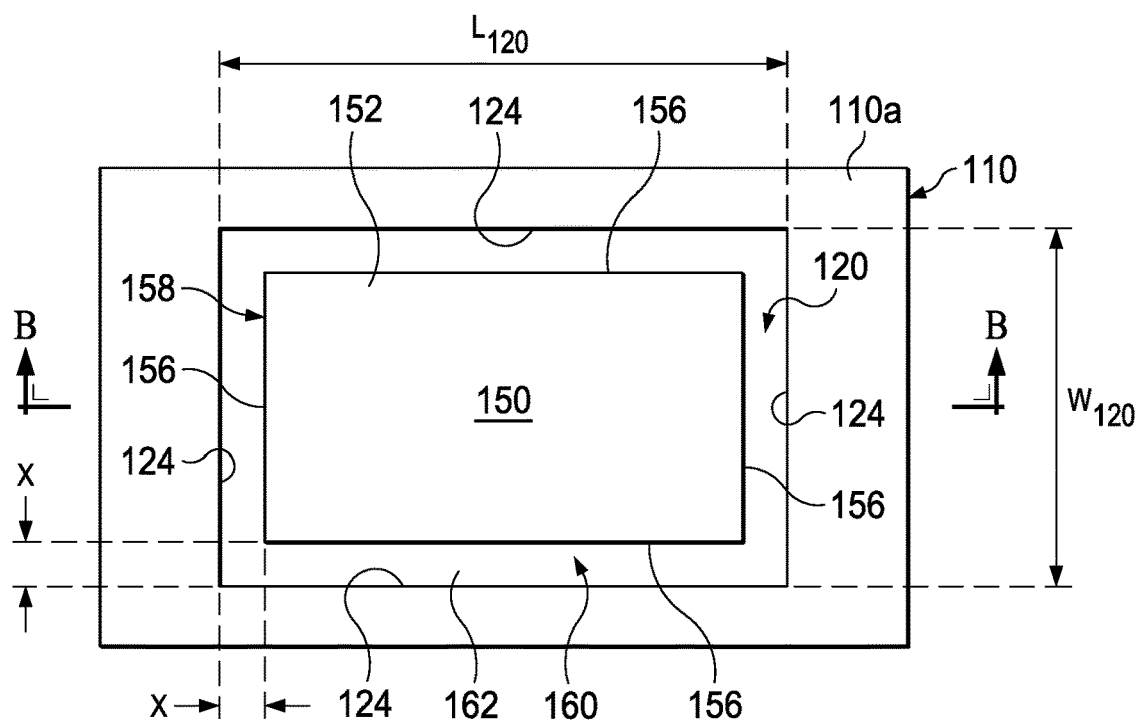
FIG. 3B is a top view of the die pad and semiconductor die of FIG. 3A according to some examples.
Figure 3C:
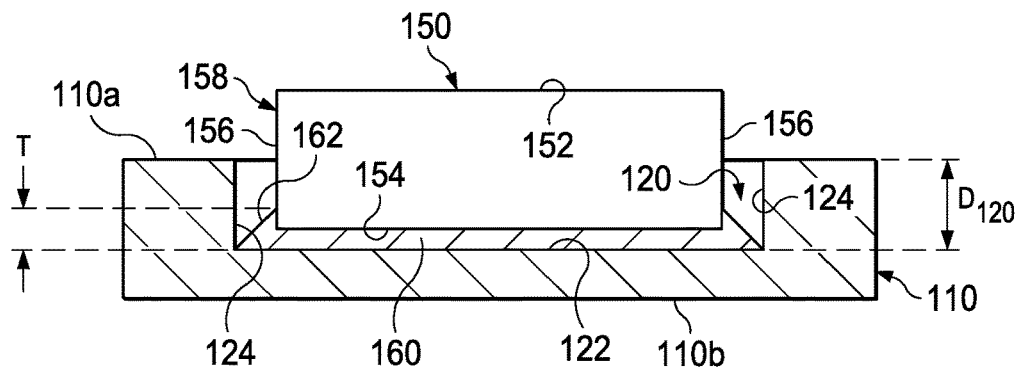
FIG. 3C is a cross-sectional view of the die pad and semiconductor die of FIG. 3A according to some examples.

Referring now to FIGS. 3A-3C, die pad 110 and die 150 are shown according to some examples. FIG. 3A shows a perspective view of die pad 110 and die 150, FIG. 3B shows a top view of die pad 110 and die 150, and FIG. 3C shows a cross-sectional view of die pad 110 and die 150 along section B-B in FIG. 3B.

As shown in FIG. 3B, recess 120 is generally rectangular in the top view (e.g., viewed normally to top side 110a of die pad 110) such that recess 120 includes a total of four side walls 124 that define a length $L_{120}$ and a width W in of recess 120. The length $L_{120}$ ranges from 972 micrometers (μm) to 2676 μm and the width $W_{120}$ ranges from 1534 μm to 4846 μm such that recess 120 accommodates a semiconductor die (e.g., die 150) as described herein. In addition, as shown in FIG. 3C, the recess 120 extends to a depth Duo measured from top side 110a to terminal surface 122 that is between 50 μm and 100 μm, such as about 75 μm.

As shown in FIG. 3C, solder member 160 may form a solder fillet 162 that extends about the outer perimeter 158 of die 150. In particular, solder fillet 162 may engage along both the side surfaces 156 of die 150 and the side walls 124 of recess 120 to secure and align die 150 within recess 120. Solder member 160 may have a dry bond line thickness T extending upward from terminal surface 122 that represents the overall thickness of the solder member 160 after the solder member 160 has been reflowed within the recess 120. The dry bond line thickness T may be measured vertically (e.g., in a direction perpendicular to top side 110a and a parallel to the side walls 124) from the terminal surface 122 to the point that solder fillet 162 extends to along the side walls 156 of die 150. The dry bond line thickness T is less than 2.5 millimeters (mm), such as from 1 mm to 2 mm to ensure that die 150 is secured within recess 120. The dry bond line thickness T may also incorporate a thickness of the solder member 160 extending between non-device side 154 of die 150 and terminal surface 122 that ranges from 50 μm to 115 μm (such as from 50.8 μm to 114.3 μm in some examples).

Without being limited to this or any other theory, a dry bond line thickness T below 1 mm provides an insufficient coverage of solder member 160 between the die 150 and recess 120 such that die 150 is not adequately secured within recess 120. Conversely, if the dry bond line thickness T of solder member 160 is above 2.5 mm, the initial thickness of the solder paste that forms the solder member 160 (e.g., before the reflow process) would be greater than the depth (Dian) of recess 120 (e.g., above top side 110a), so that during a reflow process in which the solder paste is melted to form solder member 160, the die 150 may become misaligned (e.g., via rotation and/or translation) with the recess 120. In addition, a dry bond line thickness over 2.5 mm would also cause overflow of the solder out of the recess 120 during reflowing thereby resulting in an uncontrolled movement of the solder on die pad 110.

The length $L_{120}$ and width Win of the recess 120 are selected within the ranges provided above to provide a corresponding spacing X between the side surfaces 156 and side walls 124 that, along with the above-noted depth Duo, ultimately provides a suitable bond line thickness T within the range described herein (e.g., from 1 mm to 2.5 mm). In some examples, the depth Duo ranges from 430 μm to 500 μm, such as, for instance from 432.8 μm to 495.3 μm. In some examples, the spacing X ranges from 124 to 300 μm, such as, for instance from 240 μm to 300 μm, or about 270 μm.

In addition to providing the desired dry bond line thickness T as previously described, limiting the spacing X under 300 μm facilitates formation of wire bonds 16. Specifically, a spacing X that is greater than 300 μm is not suitable for forming the wire bonds 16 so that subsequent coupling of the die 150 to terminals 112 is not possible.

Figure 5:
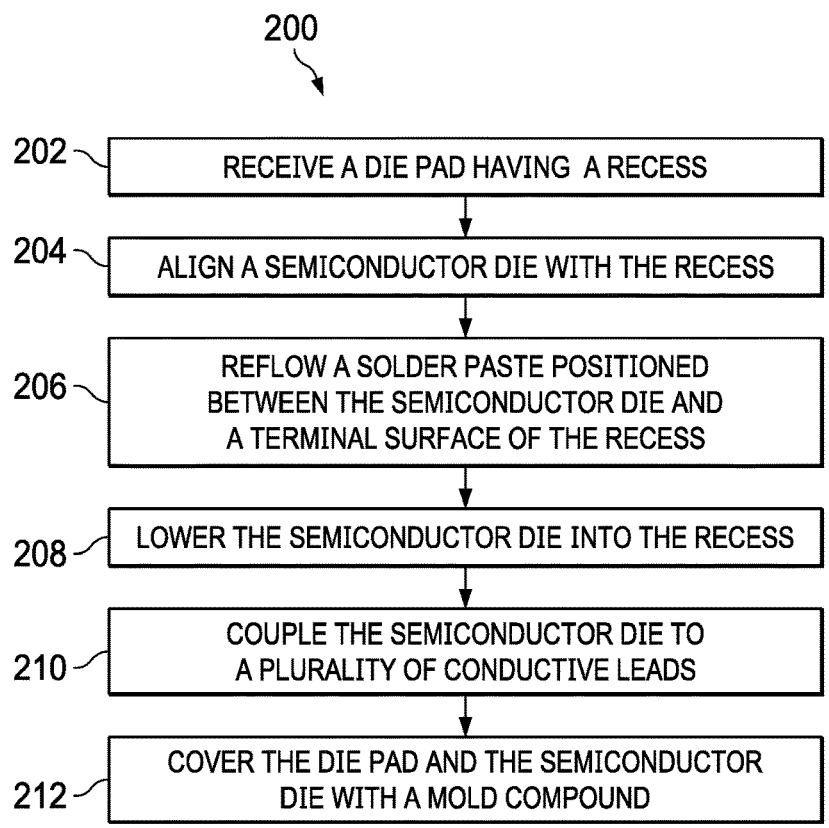
FIG. 5 is a flow diagram of a method for manufacturing a semiconductor package that may include a semiconductor die within a recess formed in a die pad according to some examples.

FIGS. 4A-4E illustrate a process for manufacturing a semiconductor chip package (e.g., package 100) that may include a semiconductor die (e.g., die 150) within a recess formed in a die pad (e.g., recess 120 in die pad 110) according to some examples. In addition, FIG. 5 is a flow diagram of a method 200 for manufacturing a semiconductor chip package that may include a semiconductor die within a recess formed in a die pad according to some examples. Accordingly, FIGS. 4A-4E and 5 are described in parallel.

Figure 4A:
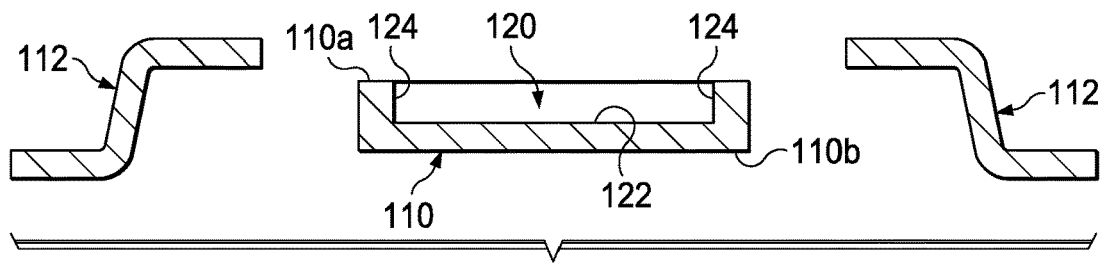
FIG. 4A-4E are sequential cross-sectional views of a process for manufacturing a semiconductor package that may include a semiconductor die within a recess formed in a die pad according to some examples.

Method 200 begins by receiving a die pad having a recess at block 202. As shown in FIG. 4A, the die pad 110 may include a recess 120 extending from a top side 110a to a terminal surface 122 as previously described. The die pad 110 may be coupled to a plurality of conductive terminals 112 via a lead frame (not specifically shown). A pair of tie bars 113 may be coupled to and may extend from die pad 110 (not shown in FIG. 4A, but tie bars 113 are illustrated in FIGS. 2A and 2B).

Figure 4B:
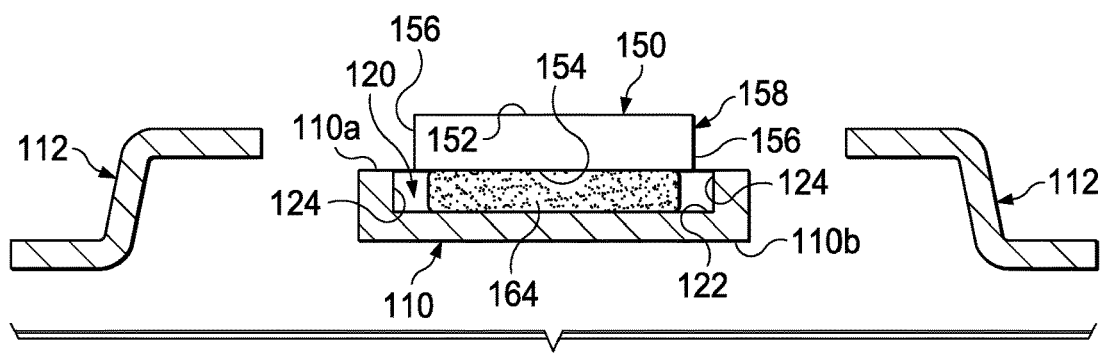

Next, method 200 includes aligning a semiconductor die with the recess at block 204. As shown in FIG. 4B, the die 150 is aligned with recess 120 on die pad 110 by placing the die 150 on top of a volume of solder paste 164 that is positioned on terminal surface 122 within recess 120. The non-device side 154 of the die 150 may be engaged with the solder paste 164 such that the device side 152 faces outward and away from recess 120. In addition, in some examples, the thickness of the solder paste 164 when initially aligning the die 150 with recess 120 may be large enough so that the non-device side 154 is aligned with or is below the top side 110a within recess 120.

Figure 4C:
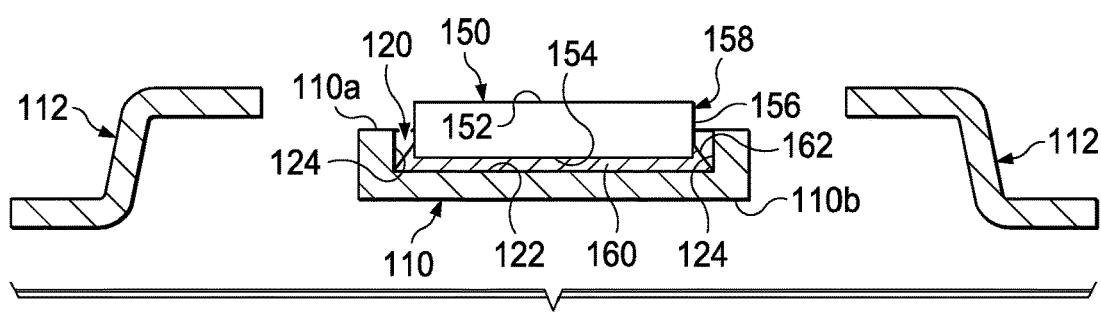

Method 200 also includes reflowing a solder paste positioned between the semiconductor die and a terminal surface of the recess at block 206, and lowering the semiconductor die into the recess at block 208. Referring now to FIGS. 4B and 4C (and particularly the progression from FIG. 4B to FIG. 4C), reflowing the solder paste may comprise applying heat (e.g., convective heat, radiative heat, conductive heat) to the solder paste 164, die pad 110, and die 150 so that the solder paste 164 liquifies before again solidifying as solder member 160 having fillets 162 to secure die 150 within recess 120 as previously described. In some examples, the die pad 110, die 150, and solder paste 160 may be placed within an oven which may apply radiative and/or convective heat thereto.

During the reflow process, the liquified solder paste 164 may flow outward toward side walls 124 of recess 120 so that the thickness of solder is reduced and die 150 is lowered into recess 120, toward terminal surface 122 (e.g., under the force of gravity). In addition, the liquified solder paste 164 may flow up the side surfaces 154 along outer perimeter 158 of die 150 and/or up the side walls 124 of recess 120 so as to form the solder fillet 162 and to achieve a desired bond line thickness (e.g., bond line thickness T shown in FIG. 3C) as previously described. In some examples, the initial thickness of the solder paste 160, prior to the reflow process, may be twice the dry bond line thickness T (FIG. 3C) of the solder paste 160 after the reflow process.

As previously described, the initial thickness of the solder paste 164 (that is, before the reflow process) is such that the non-device side 154 of die 150 is aligned with or below the top side 110a of die pad 110. Thus, as the solder paste 164 liquifies and flows outward toward side walls 124 during the reflow process as previously described, the non-device side 154 is placed below the top side 110a, within recess 120, so that lateral movement and/or rotation of die 150 is constrained by the side walls 124 of recess 120. As a result, even if there are unbalanced wetting forces within the solder paste 160 during the reflow process (e.g., such as due to uneven heat transfer), the desired position and alignment of die 150 is maintained by the recess 120.

Figure 4D:
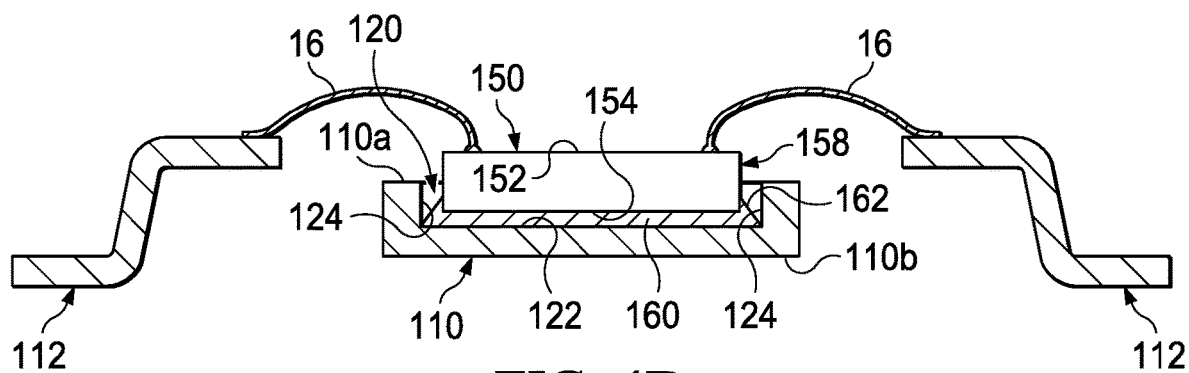

Method 200 also includes coupling the semiconductor die to a plurality of conductive terminals at block 210. As shown in FIG. 4D, the terminals 112 may be coupled to the device side 152 of die 150 via wire bonds 16. In some examples, the device side 152 may include a plurality of conductive bond pads (not shown) that couple to the wire bonds 16 and that define connection terminals or locations for the circuit (not shown) of die 150.

Figure 4E:
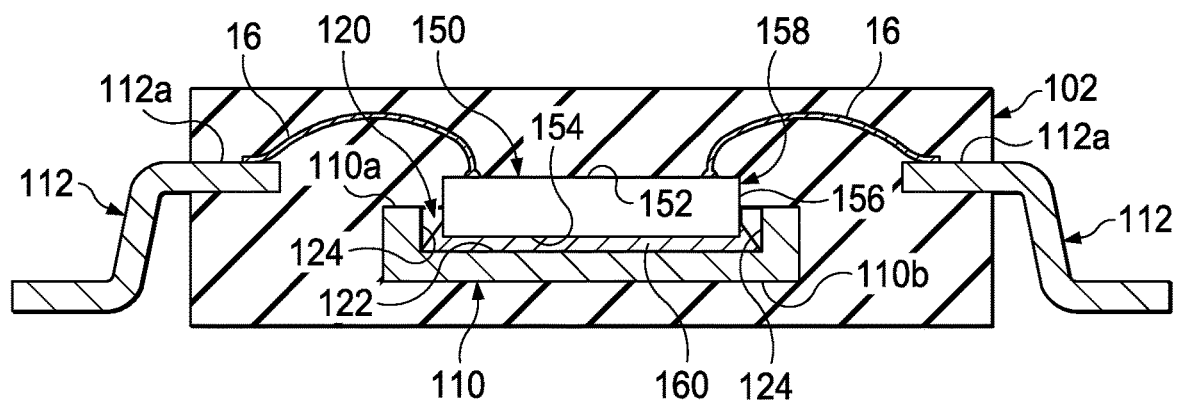

Finally, method 200 includes covering the die pad and the semiconductor die with a mold compound at block 212. As shown in FIG. 4E, the mold compound 102 may cover the die pad 110, die 150, and wire bonds 16. In addition, the mold compound 102 may also cover a portion of the terminals 112, particularly the portion of the terminals 112 that are coupled to wire bonds 16 (e.g., the uppermost surfaces 112a). A remaining portion of the terminals 112 may extend outward from the mold compound 102 such that they may be coupled (e.g., soldered) to corresponding traces on a PCB (e.g., traces 14 shown on PCB 12 in FIGS. 2A-2C). The mold compound 102 may be formed about the die 150, die pad 110, wire bonds 16, and terminals 112 via a molding process (e.g., injection molding, press molding, vacuum molding).

Moreover, the mold compound 102 may comprise a dielectric material so that mold compound 102 may insulate die 150, die pad 110, wire bonds 16, and terminals 112 from one another, and generally from the outside environment, during operations. In addition, mold compound 102 may also protect die 150, die pad 110, wire bonds 16 and terminals 112 (at least the portion positioned within the mold compound 102) from moisture, ultraviolet (UV) radiation, debris, contaminants, etc. during operations. Covering the die 150, die pad 110, wire bonds 16, and terminals 112 with mold compound 102 may complete the package 100, such that package 100 may then be coupled within an electronic device (e.g., such as by coupling the package 100 to PCB 12 of electronic device 10 as shown in FIGS. 2A-2C).

Figure 6A:
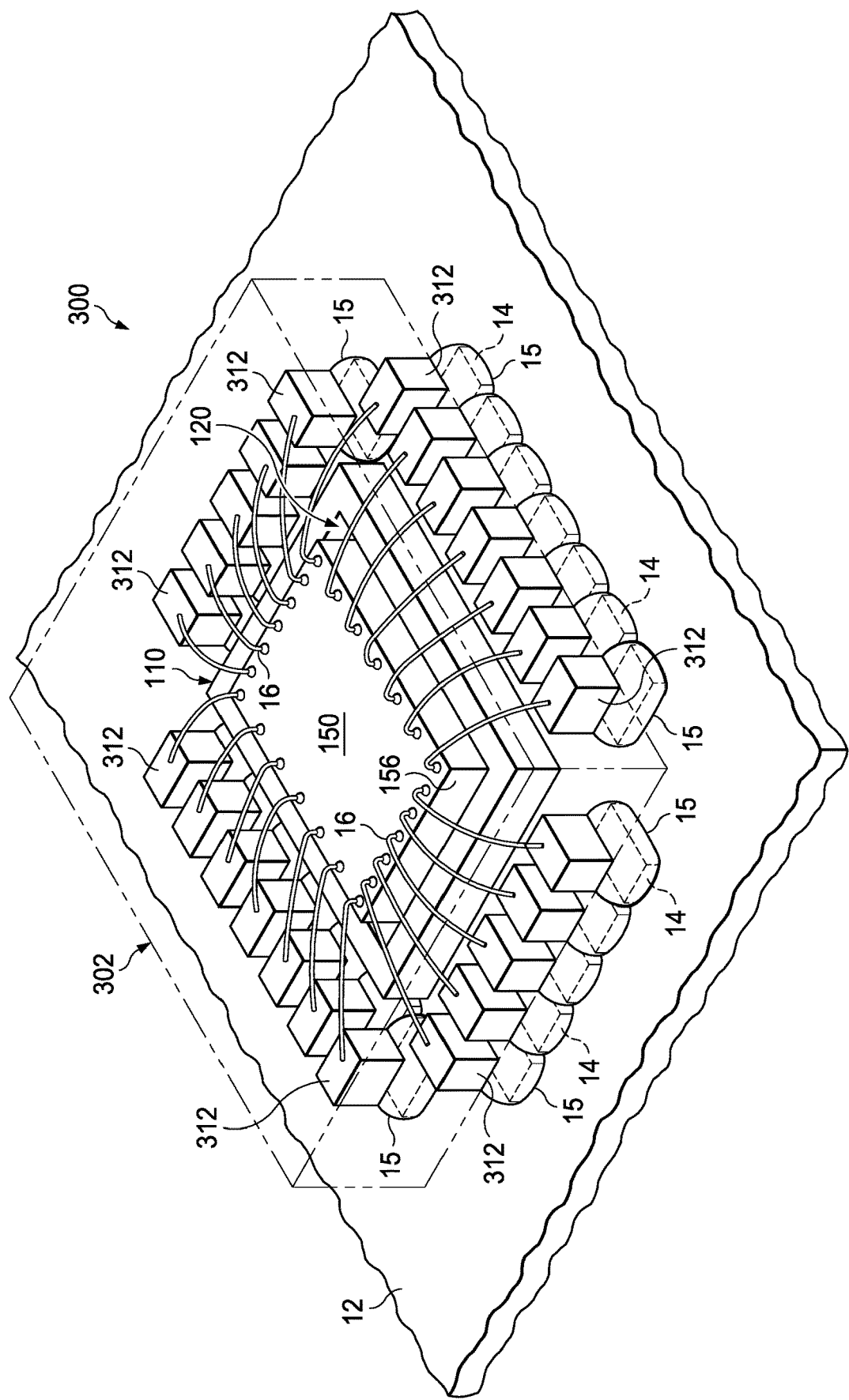
FIG. 6A is a perspective view of a PCB and semiconductor die package having a recess in a die pad for receiving a semiconductor die according to some examples.
Figure 6B:
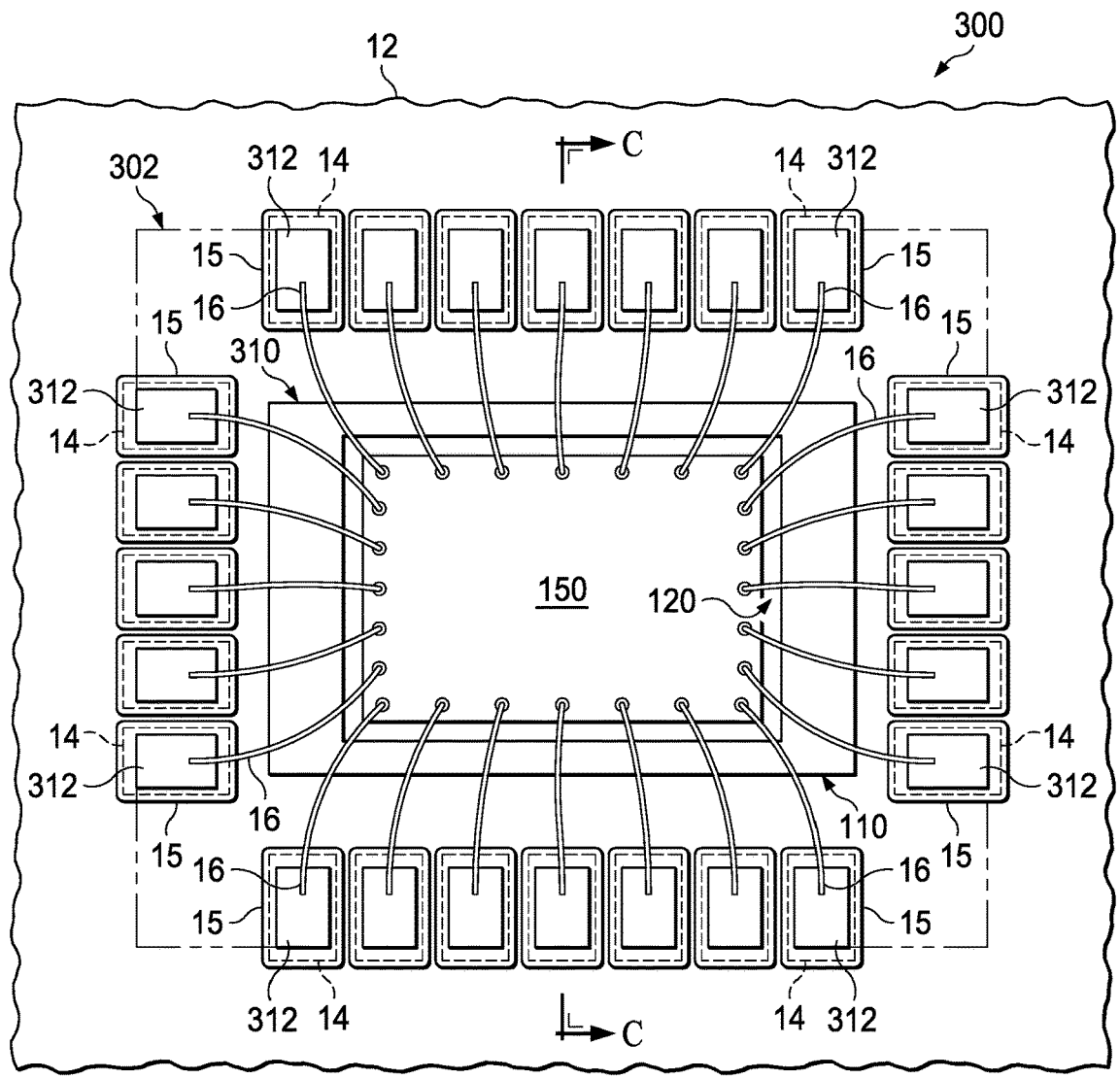
FIG. 6B is a top view of the PCB and semiconductor die of FIG. 6A according to some examples.
Figure 6C:
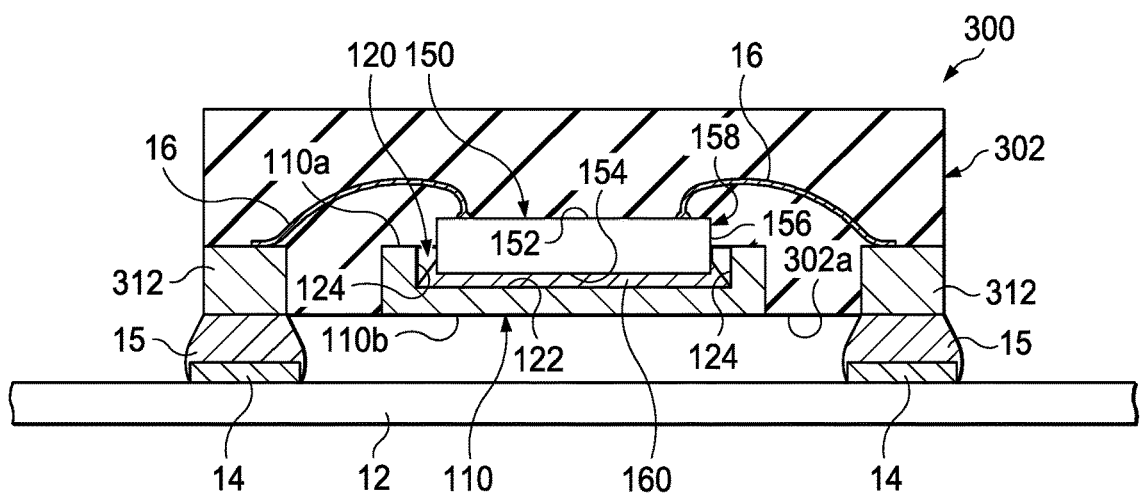
FIG. 6C is a cross-sectional view of the PCB and semiconductor die of FIG. 6A according to some examples.

Referring now to FIGS. 6A-6C a semiconductor package 300 (or more simply "package 300") having a recess 120 in a die pad 110 for receiving die 150 (or more simply "die 150") therein according to some examples is shown. FIG. 6A is a perspective view of the package 300 mounted to PCB 12, FIG. 6B is a top view of the package 300 and PCB 12, and FIG. 6C is a cross-sectional view of package 300 and PCB 12 taken along section C-C in FIG. 6B.

Package 300 includes die pad 110 having recess 120 for receiving die 150 as previously described for package 100. In addition, the die 150 may be secured within recess 120 via solder member 160. Thus, the position of the die 150 may be maintained on die pad 110 during a reflow process, even if the die 150 experiences un-balanced wetting forces as previously described.

However, in contrast to package 100, package 300 is configured as a quad flat no-lead (QFN) package that includes a plurality of conductive terminals 312 exposed along a lower surface 302a of mold compound 302 (which may be similar to mold compound 102 previously described). In addition, the die pad 110 is also aligned with and is exposed along the lower surface 302a. The conductive terminals 312 may be coupled to the die 150 via wire bonds 16 as previously described for package 100. Further, the package 300 may be secured to PCB 12 by coupling the plurality of conductive terminals 312 to the plurality of traces 14 with solder 15.

The examples disclosed herein include die pads that are configured to prevent excessive movement of a semiconductor die during a reflow process. For instance, in some examples, the example die pads may include a recess that is sized and shaped to constrain movement of the semiconductor die during a reflow process, even if the solder paste experiences unbalanced wetting forces. Thus, through use of the example die pads disclosed herein, a desired position and alignment of semiconductor die may be maintained on a die pad during a reflow process, so that instances of die misalignment may be reduced in a semiconductor package manufacturing process.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value. Modifications are possible in the described examples, and other examples are possible within the scope of the claims.

What is claimed is:

1. A semiconductor chip package, comprising:
 a conductive terminal;
 a die pad comprising a top side and a recess extending from the top side, wherein the die pad is downset relative to the conductive terminal;
 a tie bar extending from the die pad, the tie bar including a portion in a different plane compared to a plane along a surface of the die pad;
 a semiconductor die positioned within the recess, wherein the semiconductor die has an outer perimeter;
 a solder fillet engaged within the recess and with the outer perimeter of the semiconductor die;
 a wire bond coupled to the semiconductor die and the conductive terminal; and
 a mold compound covering the conductive terminal, the wire bond, the die pad, and the semiconductor die.

2. The semiconductor chip package of claim 1, wherein the recess comprises a terminal surface spaced from the top side, and wherein the solder fillet extends from the terminal surface to a point along the outer perimeter that is spaced from 1 millimeter (mm) to 2.5 mm from the terminal surface.

3. The semiconductor chip package of claim 2, wherein the solder fillet extends 50 micrometers (µm) to 115 µm from a non-device side of the semiconductor die to the terminal surface.

4. The semiconductor chip package of claim 1, wherein the outer perimeter comprises a side surface that is spaced from 240 µm to 300 µm from a side wall of the recess.

5. The semiconductor chip package of claim 4, wherein the side surface of the outer perimeter is spaced about 270 µm from the side wall of the recess.

6. The semiconductor chip package of claim 1, wherein the recess extends to a depth of 430 µm to 500 µm from the top side of the die pad.

7. A semiconductor chip package, comprising:
a mold compound;
a conductive terminal positioned within the mold compound;
a die pad positioned within the mold compound, wherein the die pad comprises a top side that is positioned lower than an uppermost surface of the conductive terminal within the mold compound, and wherein the die pad comprises a recess extending into the top side to a terminal surface;
a tie bar extending from the die pad, the tie bar including a portion in a different plane compared to a plane along the top side; and
a semiconductor die fixed within the recess with a solder member.

8. The semiconductor chip package of claim 7, wherein the solder member forms a solder fillet that extends upward from the terminal surface to a side surface of the semiconductor die.

9. The semiconductor chip package of claim 8, wherein the solder fillet extends upward between 1 millimeter (mm) to 2.5 mm from the terminal surface along the side surface of the semiconductor die.

10. The semiconductor chip package of claim 9, wherein the solder fillet extends micrometers (μm) to 115 μm from a non-device side of the semiconductor die to the terminal surface.

11. The semiconductor chip package of claim 7, wherein the semiconductor die comprises a plurality of side surfaces, and the recess comprises a plurality of side walls, and wherein the plurality of side surfaces are spaced from 240 μm to 300 μm from the plurality of side walls.

12. The semiconductor chip package of claim 11, wherein the side surface of the outer perimeter is spaced about 270 μm from the side wall of the recess.

13. The semiconductor chip package of claim 11, wherein the recess extends to a depth of 430 μm to 500 μm from the planar surface of the die pad.

14. A semiconductor chip package, comprising:
a plurality of conductive terminals, wherein each conductive terminal of the plurality of conductive terminals comprises an uppermost surface;
a die pad comprising a top side and a recess extending into the die pad from the top side to a terminal surface, wherein the top side of the die pad is positioned lower than the uppermost surface of each conductive terminal of the plurality of conductive terminals;
a semiconductor die positioned within the recess, wherein the semiconductor die has an outer perimeter; and
a solder fillet engaged within the recess and with the outer perimeter of the semiconductor die such that the solder fillet extends from the terminal surface to a point along the outer perimeter that is spaced from 1 millimeter (mm) to 2.5 mm from the terminal surface.

15. The semiconductor chip package of claim 14, wherein the outer perimeter comprises a side surface that is spaced from 240 μm to 300 μm from a side wall of the recess.

16. The semiconductor chip package of claim 15, wherein the side surface of the outer perimeter is spaced about 270 μm from the side wall of the recess.

17. The semiconductor chip package of claim 15, wherein the recess extends to a depth of 430 μm to 500 μm from the top side of the die pad.

18. The semiconductor chip package of claim 15, wherein the solder fillet extends micrometers (μm) to 115 μm from a non-device side of the semiconductor die to the terminal surface.

19. The semiconductor chip package of claim 18, comprising a plurality of wire bonds coupling a device side of the semiconductor die to the uppermost surface of each conductive terminal of the plurality of conductive terminals, wherein the device side is opposite the non-device side.

20. The semiconductor chip package of claim 19, comprising a mold compound that covers the die pad, the semiconductor die, and the uppermost surface of each conductive terminal of the plurality of conductive terminals.

* * * * *